United States Patent
Kim et al.

(10) Patent No.: US 6,337,282 B2
(45) Date of Patent: *Jan. 8, 2002

(54) METHOD FOR FORMING A DIELECTRIC LAYER

(75) Inventors: Ju-Wan Kim, Seoul; Byung-Keun Hwang; Sung-Jin Kim, both of Kyunggi-do; Jue-Goo Lee, Seoul; Chang-Hyun Cho, Seoul; Gwan-Hyeob Koh, Seoul, all of (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/364,053
(22) Filed: Jul. 30, 1999

(30) Foreign Application Priority Data

Jul. 31, 1998 (KR) .............................................. 98-31287
Apr. 30, 1999 (KR) .............................................. 99-15624

(51) Int. Cl.$^7$ ............................................ H01L 21/311
(52) U.S. Cl. ....................... 438/699; 438/700; 438/704; 438/761; 438/778; 438/787
(58) Field of Search ................. 438/761, 787, 438/699, 700, 704, 778, FOR 216, 588

(56) References Cited

U.S. PATENT DOCUMENTS

| | | | | |
|---|---|---|---|---|
| 5,089,442 A | * | 2/1992 | Olmer |
| 5,426,076 A | * | 6/1995 | Moghadam |
| 5,494,854 A | * | 2/1996 | Jain |
| 5,621,241 A | * | 4/1997 | Jain |
| 5,789,314 A | * | 8/1998 | Yen et al. |
| 5,814,564 A | * | 9/1998 | Yao et al. |
| 5,990,009 A | * | 11/1999 | Hsueh et al. |
| 6,001,740 A | * | 12/1999 | Varian et al. |
| 6,091,110 A | * | 7/2000 | Hebert et al. |
| 6,117,345 A | * | 9/2000 | Liu et al. |
| 6,150,233 A | * | 11/2000 | Horita et al. |

* cited by examiner

*Primary Examiner*—George Fourson
*Assistant Examiner*—Michelle Estrada
(74) *Attorney, Agent, or Firm*—Law Offices of Eugene M. Lee, PLLC

(57) ABSTRACT

A dielectric layer is formed by depositing a first dielectric layer above a semiconductor substrate including recessed regions, etching the first dielectric layer to remove any voids and to lower the aspect ratio of the recessed regions, and depositing a second dielectric layer on the first dielectric layer in the recessed regions. The method is particularly useful when the aspect ratios are high for recessed regions formed between patterns.

7 Claims, 5 Drawing Sheets

Fig. 1D
(Prior Art)
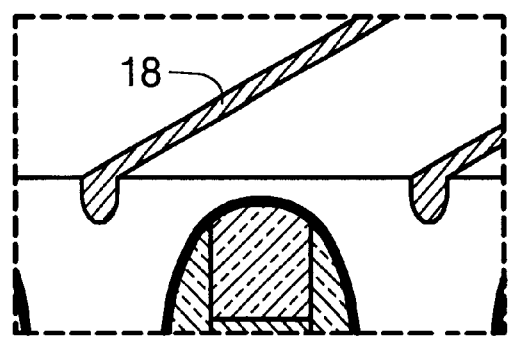
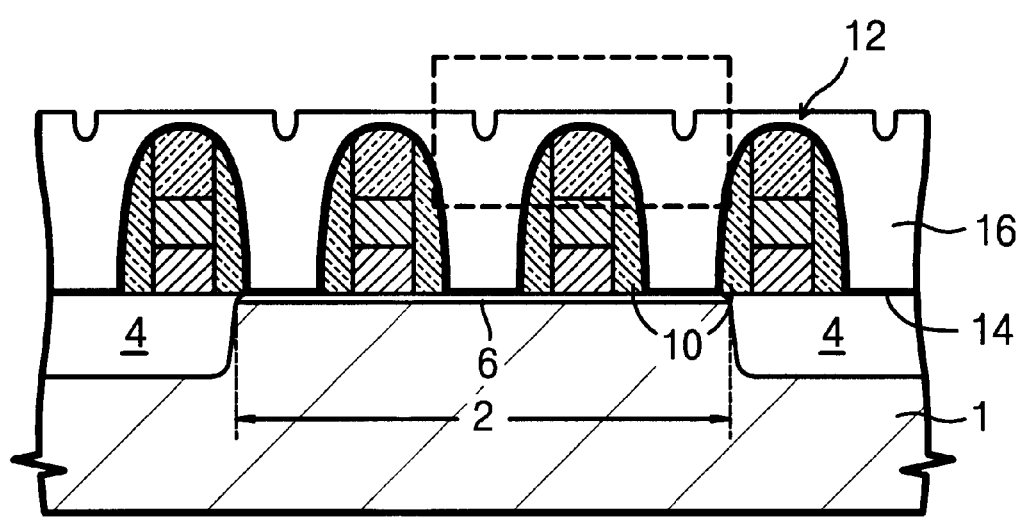
Fig. 1C
(Prior Art)

METHOD FOR FORMING A DIELECTRIC LAYER

BACKGROUND OF THE INVENTION

1. Field of the Invention

The present invention relates generally to a method of fabricating a semiconductor device, and more particularly to a method of forming a dielectric layer in an integrated circuit.

2. Description of the Related Art

As the integration density of semiconductor devices has been increasing, the pattern size of semiconductor devices has been decreasing. As an example, it is clear that design rules of less than 0.18 micrometers will be used for Giga DRAMs. When the minimum design rule of a memory cell array is scaled down, the aspect ratios of the structures within the cell array are increased. Such scaling-down may also increase the aspect ratio of recessed regions between the structures. The small size of the recessed regions causes them to be insufficiently filled by a filling material, such as a dielectric, which is deposited on them. As a result, a void is created as described in *Silicon Processing for the VLSI Era*, Vol. 11, pp. 194–199 and U.S. Pat. No. 5,494,854. The void can cause a bridge between subsequently created conductive patterns.

The dielectric layer is typically selected from a group consisting of USG (Undoped Silicate Glass), BPSG (BoroPhosphoSilicate Glass), and HDP (High Density Plasma) oxide. The use of each of these materials has its limitations. A BPSG layer can fill the recessed regions completely without void formation. However, a BPSG layer requires a high temperature (greater than about 800° C.) reflow process immediately after depositing the BPSG layer. Such a high temperature reflow undesirably causes diffusion of impurity ions around the junction, making it difficult to fabricate highly integrated devices with short channel lengths. In addition, a BPSG layer is etched quickly in a wet chemical (it has a relatively high etch rate with respect to a wet chemical) and thereby causes a poor vertical contact hole profile. As a result, it is difficult to form a contact hole with a small size. Also, due to a poor contact hole profile, a subsequently deposited conductive layer will have poor uniformity.

Although not requiring the above-mentioned high temperature reflow process, a USG layer formed by chemical vapor deposition (CVD) does not completely fill the recessed regions. Such incomplete filling causes voids, and is not compatible with highly integrated devices.

An HDP oxide has advantages of both BPSG and USG. HDP advantageously fills recessed regions with a small thermal budget due to its low temperature process and with relatively good recessed region-filling characteristics. However, when the aspect ratio is high, it is difficult to fill up a recessed region completely. In particular, an HDP oxide is not suitable for recessed regions having an aspect ratio of 3:1 or more.

FIGS. 1A–1C are cross-sectional views of a semiconductor device, taken at selected stages of a process of forming a dielectric layer according to the prior art. FIG. 1D is a perspective view of a portion of the semiconductor device.

Referring to FIG. 1A, a device isolation layer 4 is formed to define an active region 2 and an inactive region (not designated) in and on a semiconductor substrate 1. The device isolation layer 4 is made by a shallow trench isolation technique. A gate insulating layer 6, gate electrode 8, and gate etching mask 9 are sequentially formed on the active region 2. The gate electrode 8 is formed by sequentially depositing a polysilicon layer and a silicide layer. The gate etching mask 9 is made of a silicon nitride layer to a thickness in the range of 1000 Å to 2000 Å. Then, impurity ions with low concentration are implanted into the active region 2 to form a low concentration source/drain region.

Gate spacers 10 are formed on the side walls of both the gate electrode 8 and the gate etching mask 9, thereby completely forming the gate structures. The gate spacers 10 are formed by an etching process such as an etch-back process after depositing a silicon nitride layer having a thickness in the range of 300 Å to 1500 Å.

As shown in FIG. 1B, silicon oxide as a dielectric layer 16 is deposited over the substrate 1.

Finally, as shown in FIGS. 1C–1D, the top surface of the inter-layer dielectric 16 is planarized by a CMP (chemical mechanical polishing) process.

However, the foregoing method of forming a dielectric layer has the drawback of also forming voids 18 within the dielectric layer 16 as shown in FIG. 1B. Accordingly, when a polysilicon layer, for example, which is used to form pad electrodes is deposited over the semiconductor device, the polysilicon layer also penetrates into the voids 18 which are exposed by the CMP process, as shown in FIGS. 1C–1D. As a result, a bridge between pad electrodes occurs. In addition, when a void occurs in a device isolation region, a bridge between gate electrodes can occur.

Therefore, there is a need for a process of depositing a void-free dielectric layer or removing a void already formed in a dielectric layer.

SUMMARY OF THE INVENTION

The present invention was made in view of the above problems. Therefore, a feature of the present invention is directed toward providing a method of forming a void-free dielectric layer in a highly integrated device.

In accordance with one aspect of the present invention, there is provided a method of forming a void free dielectric layer on a semiconductor topology having recessed regions. A first dielectric layer is deposited over the semiconductor topology. The first dielectric layer is etched to leave a part of the first dielectric layer at bottom portions of the recessed regions. A second dielectric layer is deposited over the semiconductor topology to fill up remainders of the recessed regions.

In accordance with another aspect of the present invention, there is provided a method of forming a dielectric layer in spaces between spaced apart gate lines with an insulating layer thereon, the gate lines having been formed on a semiconductor substrate. A first inter-layer dielectric layer is deposited over the semiconductor substrate to fill the spaces. The first inter-layer dielectric layer is etched to leave a part of the first inter-layer dielectric on the spaces. A second inter-layer dielectric layer is deposited over the semiconductor substrate to fill up the remainders of the spaces. Each of the first and second inter-layer dielectric layers includes material having an etch selectivity with respect to the insulating layer.

In accordance with another aspect of the present invention, there is provided a method of forming a dielectric layer. A trench is formed in a semiconductor substrate by etching. A first dielectric layer is deposited over the substrate including the trench. The first dielectric layer is etched to leave part of the first dielectric layer on a bottom of the trench. Finally, a second dielectric layer is deposited over the substrate to fill up the remainder of the trench.

In accordance with another aspect of the present invention, there is provided a method of forming a dielectric layer. A first dielectric layer is deposited over a semiconductor substrate including a recessed region. The first dielectric layer is deposited by using helium gas as a sputtering gas. The first dielectric layer is dry etched to leave a part of the first dielectric layer on a bottom of the recessed region. A second dielectric layer is deposited over the semiconductor substrate to fill up a remainder of the recessed region with the second dielectric layer.

BRIEF DESCRIPTION OF THE DRAWINGS

The above features and advantages of the invention will become more apparent upon reference to the following description of specific embodiments and the attached drawings, wherein:

FIGS. 1A–1C are cross-sectional views of a semiconductor device, taken at selected stages of a process of forming a dielectric layer according to the prior art;

FIG. 1D is a perspective view of a portion of a semiconductor device, according to the prior art;

DESCRIPTION OF SPECIFIC EMBODIMENTS

Korean Application Nos. 98-31287, filed on Jul. 31, 1998, and 99-15624, filed on Apr. 30, 1999, are hereby incorporated by reference as if fully set forth herein.

Figure 2A:
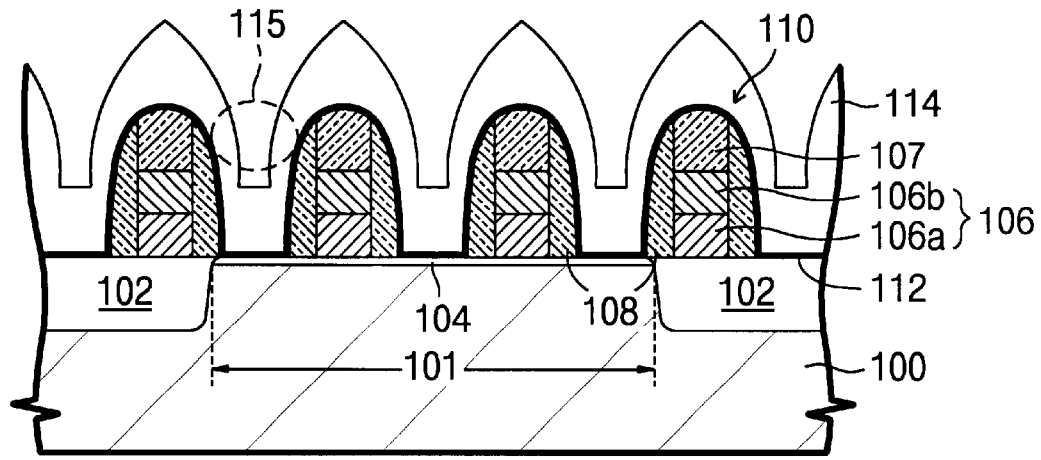
FIGS. 2A–2D are cross-sectional views of a semiconductor device, taken at selected stages of a process of forming a dielectric layer according to a first embodiment of the present invention.
Figure 2B:
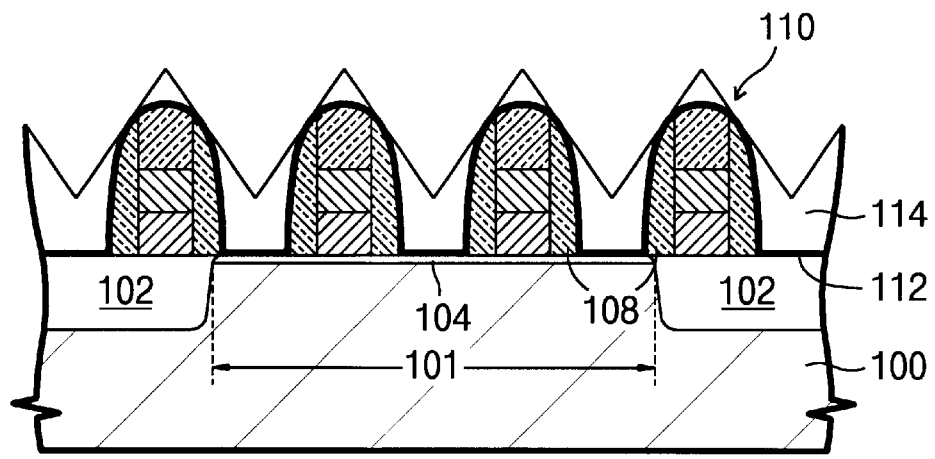

The preferred embodiment of the present invention will now be described with reference to the accompanying drawings. Referring to FIGS. 2 and 3, a novel method of forming a dielectric layer according to the present invention provides a dielectric layer which is sufficiently free of voids to prevent bridges between conductive patterns. According to the method, a first dielectric layer is deposited over an underlying region (i.e., a semiconductor substrate or one or more layers formed on the semiconductor substrate) including recessed regions formed therein. The first dielectric layer is then etched to leave a part of the first dielectric layer at the respective bottoms of the recessed regions. A second dielectric layer is then deposited over the underlying region including the first dielectric layer to fill up the recessed regions.

When a certain layer is described to be "on" or "above" another layer or substrate, the certain layer may be directly on the other layer or substrate, and one or more additional layers may be interposed between the certain layer and the other layer or substrate. An analogous definition is intended for the words "below" and "under."

First Embodiment

A first embodiment of the present invention will be described with reference to the accompanying drawings in FIGS. 2A–2D which show cross-sectional views of a semiconductor substrate at selected stages of a process of forming a dielectric layer. Referring to FIG. 2A, a device isolation layer 102 is formed to define an active region 101 and an inactive region (not designated) on a semiconductor substrate 100. The device isolation layer 102 is formed by, for example, a LOCOS (LOCal Oxidation of Silicon) method or a trench isolation method. In this embodiment, the trench isolation method is used to form the device isolation layer 102. After a gate insulating layer 104 is formed on the active region 101, gate structures 110 are formed on the gate insulating layer 104.

As a result, a recessed region is formed between each set of two adjacent gate structures. For example, for 0.18 micrometer devices, an upper width and a lower width of the recessed regions are 0.08 micrometers and 0.1 micrometers, respectively, and a height of the recessed regions is 0.4 micrometers.

Formation of the gate structures 110 includes depositing a conductive layer for gate electrodes 106 on the gate insulating layer 104. The conductive layer for the gate electrodes 106 is deposited to a thickness of about 2500 Å. In this embodiment, the conductive layer for the gate electrodes 106 is made of a multi-layer structure. A polysilicon layer 106a having a thickness of about 1000 Å and a silicide layer 106b having a thickness of about 1500 Å, are formed, in this order, over the gate insulating layer 104. A dielectric layer, also called a gate capping layer, which is used to create a gate capping mask 107, is deposited on the conductive layer for the gate electrodes 106. The dielectric layer for the gate capping mask 107 has an etch selectivity with respect to subsequent inter layer dielectrics 114, 116. For example, the dielectric layer for the gate capping mask 107 can be silicon nitride, silicon oxide, silicon oxy-nitride, or any combination of these materials. For example, when the dielectric layer is deposited to a thickness in the range of about 1600 Å to 3600 Å (preferably about 2600 Å), it may be formed of a silicon nitride layer having a thickness of 1000 Å to 2000 Å (preferably about 1500 Å), a silicon oxide layer having a thickness of 200 Å to 800 Å (preferably about 500 Å), and a silicon oxynitride layer having a thickness of 400 Å to 800 Å (preferably about 600 Å). The silicon oxy-nitride layer serves as an anti-reflective layer.

The dielectric layer for the gate capping mask 107 and the conductive layer for the gate electrodes 106 are sequentially etched using a gate forming mask to form the gate capping mask 107 and the gate electrodes 106. Then impurity ions with low concentration are implanted into the active region 101 at both sides of the gate electrodes 106 to form source/drain regions of low concentration. Alternatively, the gate electrodes 106 may be formed by etching the dielectric layer for the gate capping mask 107 to form a patterned layer, and thereafter etching the conductive layer using the patterned layer as the gate forming mask.

Next, a dielectric layer for the gate spacers 108 may be deposited on the substrate 100. The dielectric layer for the gate spacers 108 may be made of silicon nitride, silicon oxide, silicon oxy-nitride, or a combination of these materials, such as in the gate capping mask 107, and is preferably made to a thickness in the range of about 300 Å to 1500 Å. The dielectric layer for the gate spacers 108 is preferably etched by an etch-back process to form gate spacers 108 on the side walls of a laminated layer which includes the gate electrode 106 and the gate capping mask 107.

Figure 1A:
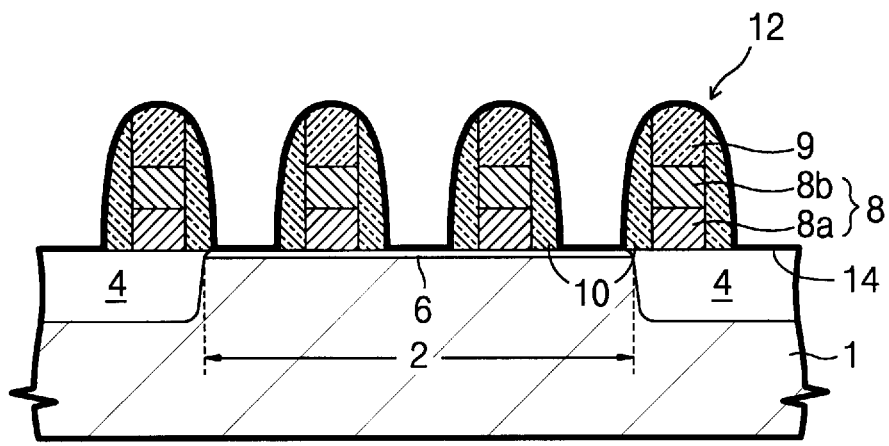
Figure 1B:
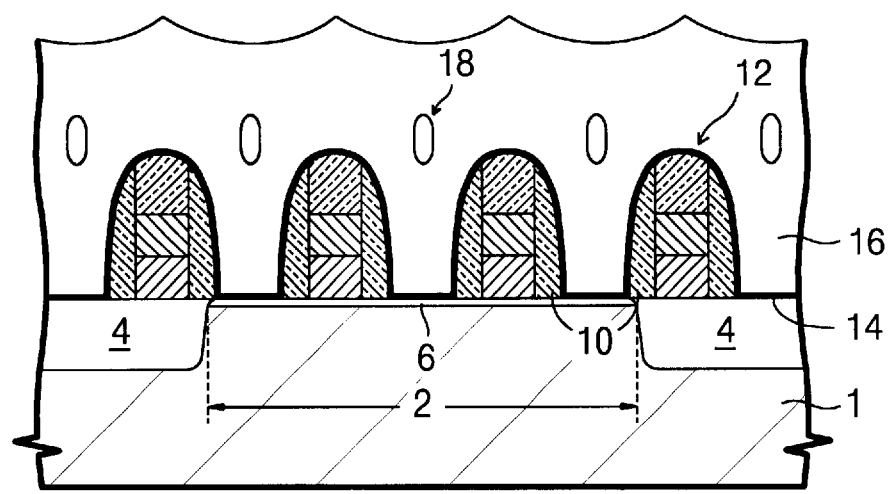

If required, an etch stopping layer 112 may be deposited over the resulting semiconductor structure (see also reference numeral 14 of FIG. 1A). The etch stopping layer 112 is preferably made of silicon nitride deposited to a thickness in the range of 50 Å to 200 Å. The etch stopping layer 112 is used to prevent the device isolation layer 102 and the active region 101 from being etched during the step of etching the later formed dielectric between gate electrodes down to the top surface of the substrate to form an opening.

A first inter-layer dielectric 114 is deposited over the etch stopping layer 112 such that it almost fills a recessed region between adjacent gate structures 110. The first interlayer dielectric 114 is preferably made of a silicon oxide such as BPSG, USG, PE-TEOS, HDP oxide, or a combination thereof. The first inter-layer dielectric 114 is deposited to a thickness in the range of 300 Å to 3000 Å, preferably 2000 A. If HDP oxide formed by a CVD method is used, an inert gas such as argon (Ar) or helium (He) may be used as a sputtering gas.

When the first inter-layer dielectric 114 is formed of an HDP oxide layer using He gas as a sputtering gas, it can be deposited under the following conditions: a low frequency power (400 kHz) in the range of 2000 W to 4000 W, a high frequency power (13.56 MHz) in the range of 500 W to 3000 W, and using a process gas including silane ($SiH_4$) gas with a flow rate in the range of 40 sccm to 120 sccm and $O_2$ gas with a flow rate in the range of 40 sccm to 300 sccm. Preferably, the low frequency power is 3000 W, the high frequency power is 1300 W, the $SiH_4$ gas has a flow rate of 80 sccm, and the $O_2$ gas has a flow rate of 120 sccm.

When He gas having a flow rate in the range of 20 sccm to 600 sccm is used as a sputtering gas, the first inter-layer dielectric 114 may have an improved deposition profile, as shown by reference numeral 115 in FIG. 2A. This is because re-sputtering of the first inter-layer dielectric 114 is low due to the fact that helium has an atomic mass of 4.

Figure 2C:
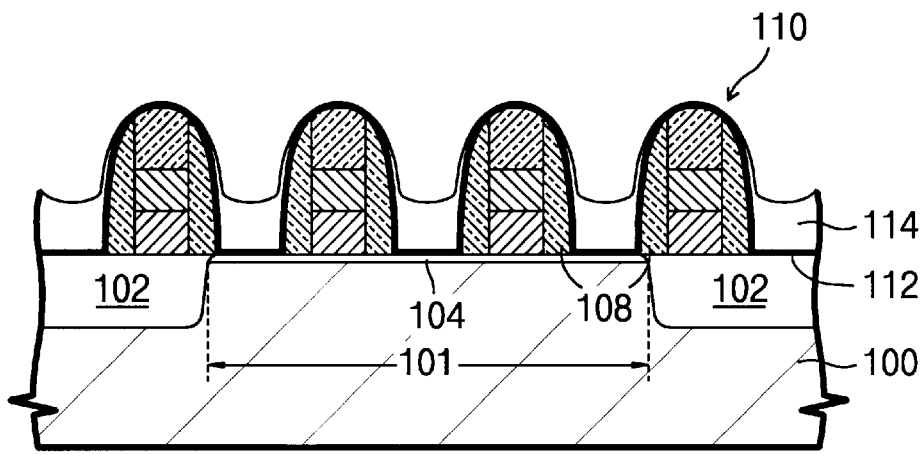
Figure 3:
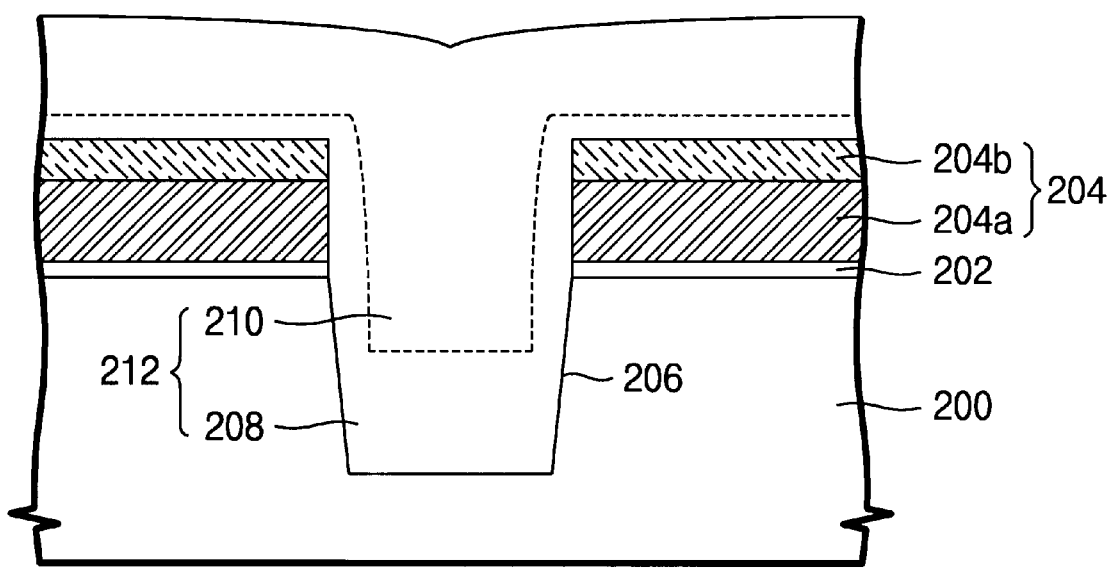
FIG. 3 is a cross-sectional view of a semiconductor device fabricated by a method of forming a dielectric layer according to a second embodiment of the present invention.

Next, the inter-layer dielectric 114 is etched to leave part of the inter-layer dielectric 114 on the bottoms of the recessed regions between the gate structures 110, as shown in FIG. 2C. The etching process can be a wet etch. Wet etch is advantageously used because the space between adjacent recessed regions can be expanded further not only in a vertical direction, but also in a horizontal direction. The wet etch process may be performed by using a typical oxide etchant such as 200:1 HF, LAL (mixture of $NH_4F$ and HF), or BOE (buffered oxide etchant).

Alternatively, a dry etch process can be performed, or wet and dry etch processes can be performed by in-situ. The dry etch process is preferably performed by using an etch gas based on at least one material selected from the group consisting of Ar, $CF_4$, $CHF_3$, He, $CH_2F_2$, and $O_2$. It should also be clear that the etching may be performed by using two separate wet etch processes. Alternatively, a combination of dry and wet etch processes can be employed.

FIGS. 2B and 2C schematically show in detail the process of etching the first interlayer dielectric 114 using a combination of dry and wet etch processes, more particularly by first dry etching and then wet etching.

Referring now to FIG. 2B, part of the first inter-layer dielectric 114 is removed by dry etching. The depth of the etching of the first inter-layer dielectric 114 is in the range of 150 Å to 500 Å, preferably 300 Å. The dry etching process can be performed with the following conditions. Both the low frequency power (400 kHz) and the high frequency power (13.56 MHz) preferably have a range of 2000 W to 4500 W. The etch gas may be helium gas, $O_2$ gas, or a mixture thereof. Preferably, a mixture gas is used. When helium gas is used, it preferably has a flow rate of 390 sccm. When $O_2$ gas is used, it preferably has a flow rate of 30 sccm.

As shown in FIG. 2B, after the dry etch process the profile of the first inter-layer dielectric 114 is improved. Therefore, deposition of a second inter-layer dielectric 116 can be performed immediately without performing a wet etch process. However, so as to increase the likelihood of a void-free inter-layer dielectric, it is desirable that a wet etch process be performed immediately after the dry etch process.

The wet etch process which is performed immediately after the dry etch process can be performed with the following conditions. The first inter-layer dielectric 114 is etched in the range of 100 Å to 400 Å, preferably 200 Å, in depth. The wet etch process is then performed by using a typical oxide etchant such as 200:1 HF, LAL, or BOE. As a result of this wet etch process, as shown in FIG. 2C, a top surface of the substrate 100 is smoothed, and the recessed portion between gate electrodes has a low aspect ratio which provides a good surface topology for a later-formed second interlayer dielectric.

Figure 2D:
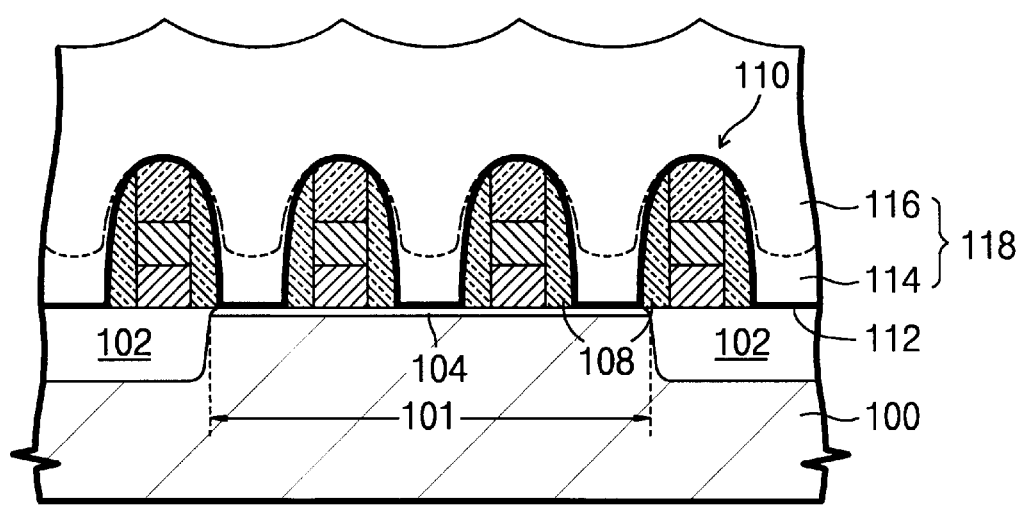

Subsequently, as shown in FIG. 2D, a second inter-layer dielectric 116 is deposited over the substrate 100, including the first inter-layer dielectric 114, to fill up the recessed regions. As a result, a void free inter-layer dielectric 118, a combination of the first and second inter-layer dielectrics 114 and 116, is formed as shown in FIG. 2D. The second inter-layer dielectric 116 can be made of the same material as that of the first inter-layer dielectric 114, such as an HDP oxide. Alternatively, the second inter-layer dielectric 116 can be made of a material different from that of the first inter-layer dielectric 114, such as USG or PE-TEOS.

The second inter-layer dielectric 116 is deposited to a thickness in the range of 300 Å to 3000 Å, preferably 2800 Å. Deposition of the second inter-layer dielectric 116 such as an HDP oxide layer can be performed under the following conditions. The low frequency power has a range of 2000 W to 4000 W and the high frequency power has a range of 500 W to 4000 W. As process gases, silane ($SiH_4$) gas has a flow rate in the range of 40 sccm to 120 sccm and $O_2$ gas has a flow rate in the range of 40 sccm to 300 sccm. As a sputtering gas, helium gas is used. Preferably, the low frequency power is 3000 W, the high frequency power is 2000 W, the flow rate of silane is 120 sccm, and the flow rate of helium is 390 sccm.

According to the first embodiment of the present invention, the aspect ratio of the recessed regions can be reduced because part of the first inter-layer dielectric 114 is left behind in the recessed regions. Therefore, a void is not produced during the deposition of the second inter-layer dielectric 116.

Subsequently, the top surface of the second inter-layer dielectric 116 is planarized by using an etch-back process or a CMP process.

Second Embodiment

FIG. 3 is a cross-sectional view of a semiconductor substrate depicting a method of forming a dielectric layer in accordance with a second embodiment of the present invention. Referring to FIG. 3, a pad oxide 202, a pad nitride 204a, and an HTO oxide 204b are deposited sequentially on a semiconductor substrate 200 and then patterned by using a photolithography process which is well-known in this art. As a result, a trench etch mask 204 is formed which comprises the pad nitride 204a and the HTO oxide 204b. The substrate 200 is etched using the trench etch mask 204 to form a trench 206 therein. Thermal oxidation is then performed to form an oxide film on both sidewalls and the bottom of the trench 206.

A first trench isolation layer 208 is deposited over the substrate 200 including the trench 206. The first trench isolation layer 208 is preferably made of USG or HDP oxide.

Next, the first trench isolation layer 208 is etched so as to leave part of it on the bottom of the trench 206. Thus, a void can be removed that may be formed during and after depositing the first trench isolation layer 208. The etching of the first trench isolation layer 208 is performed by a dry etch process, a wet etch process, or a combination of dry and wet etch processes.

A second trench isolation layer 210 is deposited to fill up the trench 206. The second trench isolation layer 210 can be made of the same material as that of the first trench isolation layer 208. Alternatively, the second trench isolation layer 210 can be made of a material different from that of the first trench isolation layer 208, such as PE-TEOS. As a result of depositing the second trench isolation layer 210, a void-free trench isolation layer 212 is completely formed.

The processes of depositing the first and the second trench isolation layers 208, 210 are preferably performed by using a sputtering gas such as argon gas or helium gas.

Thus, a method of forming a dielectric layer has been described according to the present invention. While the invention is susceptible to various modifications and alternative forms, specific embodiments have been shown by way of example in the drawings and described in detail herein. However, it should be understood that the invention is not limited to the particular forms disclosed as these are to be regarded as illustrative, rather than restrictive. Rather, the invention covers all modifications, equivalents, alternatives, processes, and structures falling with the spirit and scope of the invention as defined in the appended claims. For example, the invention is applicable to all processes of filling up a recessed region, a narrow space, or a recessed portion with a material layer, such as a conductive layer, or a dielectric layer.

What is claimed is:

1. A method of forming an insulating layer in spaces between spaced apart gate lines having sidewall spacers and a hard mask layer on the gate line, the gate lines being formed on a semiconductor substrate, the method comprising:

depositing an HDP oxide layer over the substrate having the gate lines to fill the spaces;

wet-etching the HDP oxide layer to leave a part of the oxide layer in the spaces, wherein the remaining part of the HDP oxide layer only exists in lower portions of the spaces between the gate lines; and depositing a dielectric layer over the substrate having the remaining part of the HDP oxide layer to fill up upper portions of the spaces.

2. The method according to claim 1, wherein depositing the HDP oxide layer is performed using a first sputtering gas selected from the inert gas group consisting of argon (Ar) and helium (He), and depositing the dielectric layer is performed using a second sputtering gas selected from the inert gas group consisting of argon and helium.

3. The method according to claim 1, further comprising dry-etching the HDP oxide layer prior to wet-etching the HDP oxide layer.

4. The method according to claim 1, further comprising dry-etching the HDP oxide layer after wet-etching the HDP layer.

5. The method according to claim 3, wherein the dry etching is performed using a sputtering gas selected from the group consisting of argon and helium, and a process gas of oxygen gas.

6. The method according to claim 4, wherein the dry etching is performed using a sputtering gas selected from the group consisting of argon and helium, and a process gas of oxygen gas.

7. The method according to claim 1, further comprising depositing an etch stopper prior to depositing the HDP oxide layer, wherein the etch stopper has an etching selectivity with respect to the HDP oxide layer and the dielectric layer.

* * * * *